(12) United States Patent
Kok et al.

(10) Patent No.: US 9,864,282 B2
(45) Date of Patent: Jan. 9, 2018

(54) SENSOR SYSTEM FOR LITHOGRAPHY

(71) Applicant: ASML Netherlands B.V., Veldhoven (NL)

(72) Inventors: Haico Victor Kok, Veldhoven (NL); Robbert Jan Voogd, Neerpelt (BE)

(73) Assignee: ASML NETHERLANDS B.V., Veldhoven (NL)

(*) Notice: Subject to any disclaimer, the term of this patent is extended or adjusted under 35 U.S.C. 154(b) by 0 days.

(21) Appl. No.: 15/486,077

(22) Filed: Apr. 12, 2017

(65) Prior Publication Data

US 2017/0219937 A1 Aug. 3, 2017

Related U.S. Application Data

(63) Continuation of application No. 14/436,046, filed as application No. PCT/EP2013/068669 on Sep. 10, 2013, now Pat. No. 9,690,207.

(Continued)

(51) Int. Cl.
*G03F 7/20* (2006.01)
*G01B 11/06* (2006.01)
(Continued)

(52) U.S. Cl.
CPC ...... *G03F 7/70775* (2013.01); *G01B 11/0675* (2013.01); *G01B 11/14* (2013.01);
(Continued)

(58) Field of Classification Search
CPC . G01B 11/14; G01B 11/0675; G03F 7/70483; G03F 7/70775; G03F 9/7046; G03F 9/7049; G03F 9/7092
See application file for complete search history.

(56) References Cited

U.S. PATENT DOCUMENTS 4,613,981 A    9/1986  Siddall et al.
5,155,370 A   10/1992  Osawa et al.
(Continued)

FOREIGN PATENT DOCUMENTS

CN       1983037        6/2007
CN     102540778        7/2012
(Continued)

OTHER PUBLICATIONS

International Search Report and Written Opinion dated Nov. 28, 2013 in corresponding International Patent Application No. PCT/EP2013/068669.

(Continued)

*Primary Examiner* — Michelle M Iacoletti

(74) *Attorney, Agent, or Firm* — Pillsbury Winthrop Shaw Pittman LLP

(57) ABSTRACT

A sensor system to measure a physical quantity, the system including a parallel detection arrangement with multiple detectors to allow measurements in parallel at different spatial locations, wherein the multiple detectors share a noise source, wherein the sensor system is configured such that the multiple detectors each output a signal as a function of the physical quantity, and wherein the sensor system is configured such that at least one detector responds differently to noise originating from the shared noise source than the one or more other detectors.

20 Claims, 4 Drawing Sheets

Related U.S. Application Data

(60) Provisional application No. 61/715,167, filed on Oct. 17, 2012.

(51) Int. Cl.
*G01B 11/14* (2006.01)
*G03F 9/00* (2006.01)

(52) U.S. Cl.
CPC ........ *G03F 7/70525* (2013.01); *G03F 9/7046* (2013.01); *G03F 9/7049* (2013.01); *G03F 9/7092* (2013.01)

(56) References Cited

U.S. PATENT DOCUMENTS

| | | | |
|---|---|---|---|
| 6,034,378 A | | 3/2000 | Shiraishi |
| 2006/0023178 A1 | * | 2/2006 | Loopstra ............ G03F 7/70458 355/53 |
| 2006/0061746 A1 | | 3/2006 | Kok et al. |
| 2009/0242742 A1 | | 10/2009 | Hane et al. |

FOREIGN PATENT DOCUMENTS

| JP | S62-229942 | 10/1987 |
|---|---|---|
| JP | H07-153660 | 6/1995 |
| JP | H08-213300 | 8/1996 |
| JP | H11-121325 | 4/1999 |
| JP | 2009-288058 | 12/2009 |

OTHER PUBLICATIONS

Ching-Fen Kao et al., "Reflective-type optical encoder based on fractional Talbot self-image effect using phase grating," Proc. of SPIE, vol. 7544, pp. 75440N-1-75440N-6 (Aug. 24, 2010).

International Preliminary Report on Patentability dated Apr. 30, 2015 in corresponding International Patent Application No. PCT/EP2013/068669.

Taiwan Office Action dated Jun. 11, 2015 in corresponding Taiwan Patent Application No. 102134875.

Chinese Office Action dated Mar. 21, 2016 in corresponding Chinese Patent Application No. 2013800591433.

Japanese Office Action dated May 26, 2016 in corresponding Japanese Patent Application No. 2015-537174.

Chinese Office Action dated Nov. 21, 2016 in corresponding Chinese Patent Application No. 201380059143.3.

European Office Action dated Jan. 5, 2017 in corresponding European Patent Application No. 13 759 242.4.

\* cited by examiner

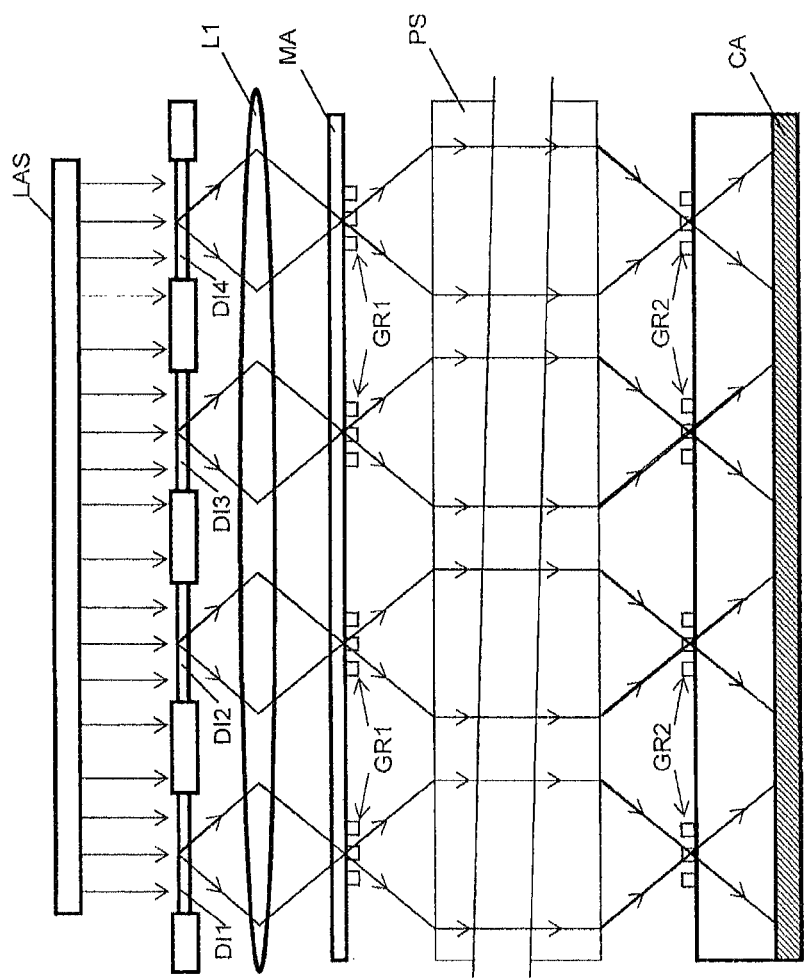

SENSOR SYSTEM FOR LITHOGRAPHY

This application a continuation of U.S. patent application Ser. No. 14/436,046, which was filed on Apr. 15, 2015, now allowed, which is the U.S. national phase entry of PCT patent application no. PCT/EP2013/068669, which was filed on Sep. 10, 2013, which claims the benefit of priority of U.S. provisional application No. 61/715,167, which was filed on Oct. 17, 2012, each of which are incorporated herein in its entirety by reference.

FIELD

The present invention relates to a sensor system to measure a physical quantity, a lithographic apparatus comprising the sensor system, and a method of transferring a pattern from a patterning device onto a target portion of a substrate using the sensor system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, many sensor systems are used to measure all kinds of physical quantities. Examples of interesting quantities are distance/position, time, speed, acceleration, force, lens aberration, etc, Some of these sensor systems use a detector that outputs a periodically varying signal. Such a periodically varying signal may be obtained using a periodic structure, such as a grating. The periodic varying signal may have, for instance, a sinusoidal shape.

SUMMARY

In the situation of multiple measurements at different spatial locations, the measurement time may be reduced by using a parallel detection arrangement with multiple detectors allowing measurements in parallel, e.g., at the same time, at different spatial locations. When using such a parallel detection arrangement, it is advantageous, for example, from a production point of view and a cost point of view to share the same components such as power or signal components, where power components are used to provide energy to the detectors and the signal components are usually used to manipulate the signal in a direct or indirect way.

However, although a parallel detection arrangement improves measurement speed, it remains challenging for such a sensor system to maintain good measurement reproducibility or even improve it when stricter demands may require that. An obvious way of improving measurement reproducibility is to increase the measurement time, but in a lithographic apparatus this may not be a viable option because of throughput demands.

It is desirable to provide, for example, a sensor system to measure a physical quantity, wherein the sensor system has improved measurement reproducibility.

According to an embodiment of the invention, there is provided a sensor system to measure a physical quantity, the system including a parallel detection arrangement with multiple detectors to allow measurements in parallel at different spatial locations, wherein the multiple detectors share at least one noise source, wherein the sensor system is configured such that the multiple detectors each output a signal as a function of the physical quantity, and wherein the sensor system is configured such that at least one detector responds differently to noise originating from the shared noise source than the other detectors.

According to an embodiment of the invention, there is provided a sensor system to measure a physical quantity in at least two directions, the system including a parallel detection arrangement with multiple detectors to allow measurements in parallel at different spatial locations, wherein the multiple detectors share at least one noise source, wherein each detector is configured to measure in one direction of the at least two directions at a time, wherein the sensor system is configured such that the multiple detectors each output a signal as a function of the physical quantity, and wherein the sensor system is configured such that during a parallel measurement at least one detector is measuring in a direction different from the other detectors at the same time.

According to an embodiment of the invention, there is provided a control system comprising a sensor system as described herein, at least one actuator, and a control unit configured to provide a drive signal to the at least one actuator based on the output of the multiple detectors.

According to an embodiment of the invention, there is provided a lithographic apparatus comprising a sensor system as described herein.

According to an embodiment of the invention, there is provided a pattern transferring method comprising:

measuring a position of a patterning device relative to a substrate table configured to hold a substrate using a sensor system as described herein, the patterning device configured to impart a radiation beam with a pattern in its cross-section to form a patterned radiation beam;

aligning a target portion on a substrate held by the substrate table with the patterning device based on the measured position; and projecting the patterned radiation beam onto the target portion of the substrate to transfer a pattern from the patterning device to the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2D depicts schematically a parallel detection arrangement using multiple detectors according to FIG. 2A;

DETAILED DESCRIPTION

Figure 1:
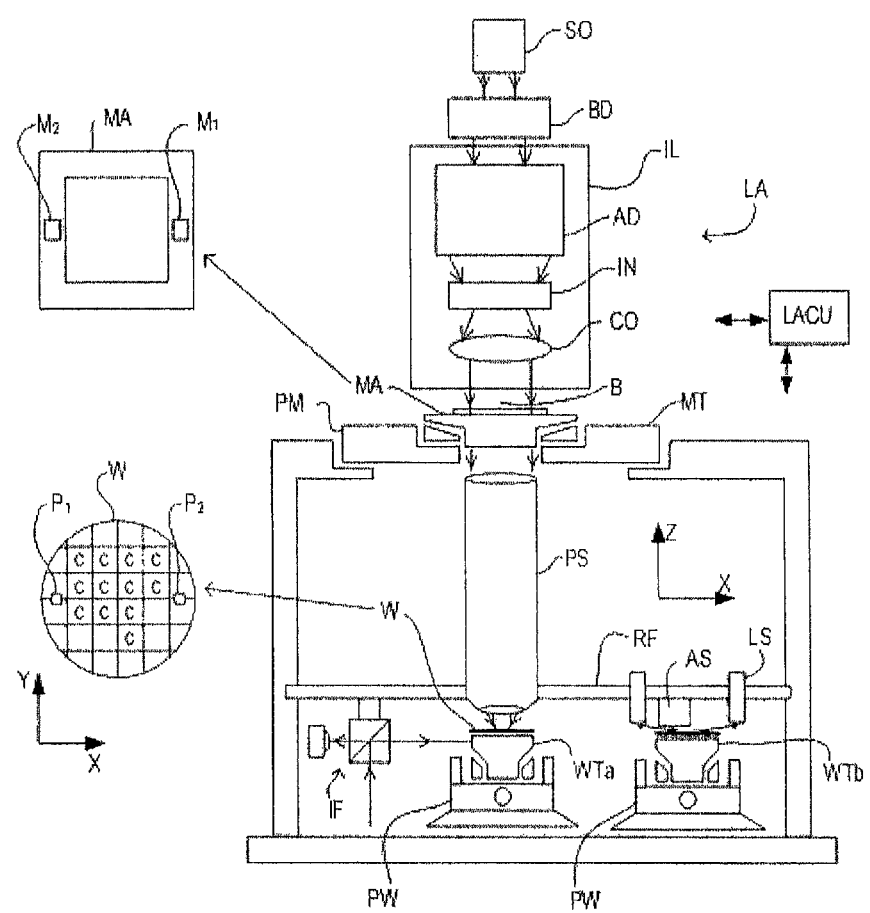
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (and/or two or more patterning device tables). In such "multiple stage" machines the additional tables may be used in parallel, or preparatory steps may be carried out on one or more tables while one or more other tables are being used for exposure. As an example, the two substrate tables WTa and WTb in the example of FIG. 1 are an illustration of this. An embodiment of the invention disclosed herein can be used in a stand-alone fashion, but in particular it can provide additional functions in the pre-exposure measurement stage of either single- or multi-stage apparatuses. In an embodiment, the lithographic apparatus may have a substrate table and a measurement table, wherein the measurement table is not designed to hold a substrate (and is design to provide measurement functionality and optionally other functionality, such as cleaning).

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa and WTb and two stations, e.g., an exposure station and a measurement station, between which the tables may be exchanged. For example, while a substrate on a substrate table is being exposed at the exposure station, another substrate can be loaded onto another substrate table at the measurement station or a measurement table may be located at the measurement station, so that various preparatory steps may be carried out. The preparatory steps may include mapping the surface of the substrate using a level sensor LS and measuring the position of alignment markers using an alignment sensor AS. This enables a substantial increase in the throughput of the apparatus. If the position sensor IF is not capable of measuring the position of the table while it is at the measurement station as well as at the exposure station, a second position sensor may be provided to enable the positions of the table to be tracked at both stations. In a variation, for example, the apparatus may comprise a measurement table WTb and a substrate table WTa. In this variation, while the substrate table WTa is at a measurement station (where, for example, the substrate is unloaded and measurements do not necessarily occur at that station), the measurement table WTb is located at the exposure station to enable measurements (e.g., measurements using the projection system).

The apparatus further includes a lithographic apparatus control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2B:
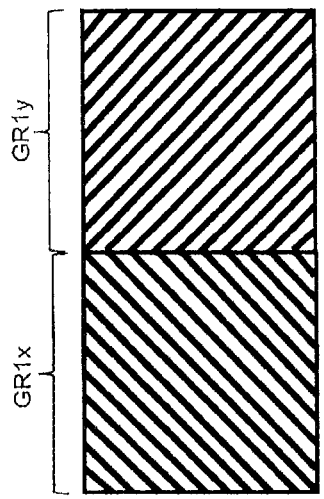
FIG. 2B depicts an input grating that can be used in the sensor system of FIG. 2A.
Figure 2C:
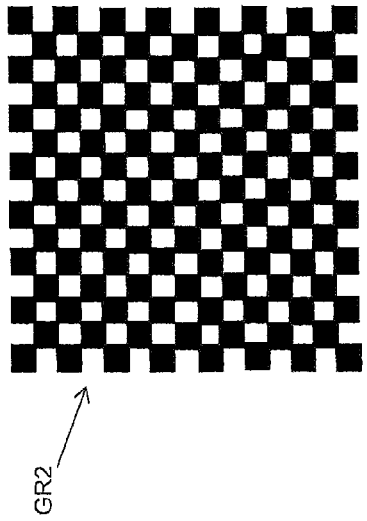
FIG. 2C depicts a detection grating that can be used in the sensor system of FIG. 2A.
Figure 2A:
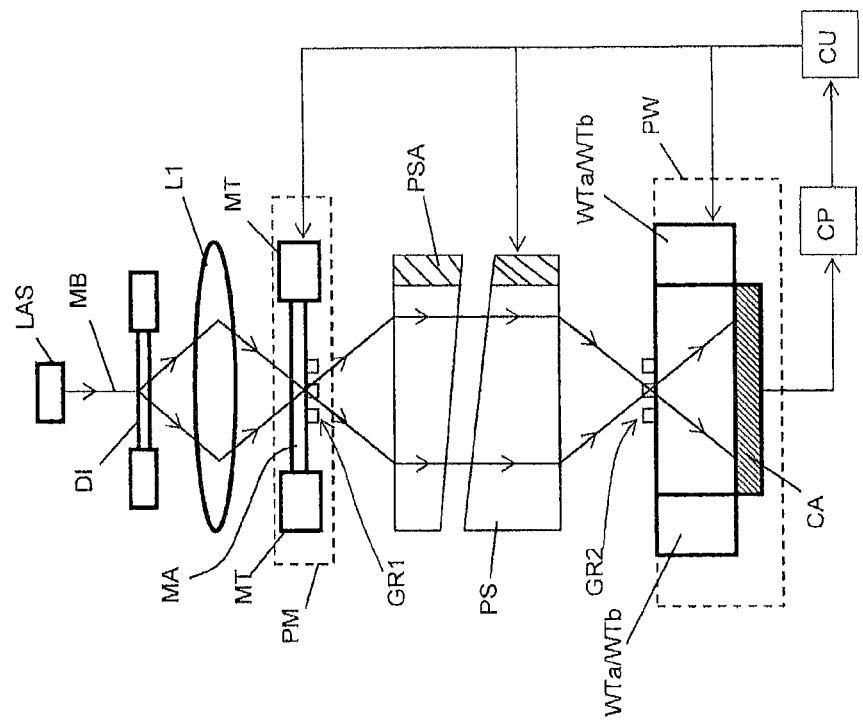
FIG. 2A depicts a part of the lithographic apparatus of FIG. 1 in more detail and a detector of a sensor system according to an embodiment of the invention.

FIG. 2A depicts in more detail a part of the lithographic apparatus of FIG. 1. Shown schematically is the patterning device MA which is supported by the support structure MT and can be moved in one or more directions by the first positioner PM (indicated schematically by dashed lines). Also schematically shown is the table WTa/WTb, which can be moved by the second positioner PW (indicated by dashed lines). The projection system PS is also schematically depicted here, wherein only an upper and lower portion are schematically drawn.

FIG. 2A further depicts a detector of a sensor system which can be used to measure aberration in the projection system and/or the position of the patterning device MA relative to the table WTa/WTb. The sensor system comprises a laser output LAS or any other suitable radiation source output configured to provide a measurement beam MB. In an embodiment, the sensor system comprises a laser or any other suitable radiation source associated with the output LAS. The measurement beam from the output LAS is first spread by a diffuser DI and subsequently focused by optical element L1 onto an input grating GR1, in this case a patterning device grating GR1 provided on or associated with the patterning device MA.

The grating GR1 modulates the radiation from the laser LAS in a certain direction to form a modulated measurement beam and the modulated radiation is subsequently passed through the projection system PS. The projection system PS forms an image of the modulated measurement beam that is projected onto a detection grating GR2 provided, for example, on the table WTa/WTb. The interaction between the image from the projection system PS and the detection grating GR2 provides a plurality of overlapping wavefronts which will interfere with each other. The interference pattern is detected by a camera CA, e.g. a CCD camera, positioned at a distance from the detection grating GR2. Aberrations present in the wavefronts and the relative position between the input grating GR1 and the detection grating GR2 will influence the resulting interference patterns.

Usually, the patterning device and detection grating are stepped relative to each other in a direction corresponding to the modulation of the modulated measurement beam and an image is captured by the camera at each step. The intensity data obtained by the camera and representing the overlapping and interfering copies of the wavefront is processed in a camera processing unit CP, where it may for instance be fitted to Zernike polynomials to yield Zernike coefficients, each Zernike coefficient providing information about a position or particular aberration in the modulation direction. For the position, the outcome is a periodically varying signal of which the period is determined by the pitch of the input and detection gratings.

In a similar way, information may be obtained about aberration and/or position in a direction perpendicular to the above described modulation direction. To allow this, the input grating GR1 may comprise two parts GR1x and GR1y, see FIG. 2B, wherein during a first measurement the GR1x part is used to modulate the measurement beam and during a second measurement the GR1y part is used to modulate the measurement beam. Because the lines of the two grating parts GR1x and GR1y are orthogonal to each other, the modulation directions associated with the grating parts are also orthogonal to each other.

The detection grating GR2 may also comprise two parts corresponding to the two grating parts GR1x and GR1y, but it is also possible to use a single grating in the form of a checkerboard as shown in FIG. 2C, which can be used for both grating parts GR1x and GR1y. It will be apparent to a person skilled in the art of such sensor systems that there exist many grating variants that can be used to obtain aberration and/or position information in two directions in a similar manner as described in relationship to FIGS. 2A, 2B and 2C. These variants will not explicitly be described here, but fall within the scope of an embodiment of the invention.

In order to quickly measure at different spatial locations, multiple detectors as depicted in FIG. 2A may be provided, hence, multiple input gratings GR1 are provided, e.g., on the patterning device MA, and multiple corresponding detection gratings GR2 are provided on, e.g., the table WTa/WTb. By illuminating the gratings GR1 at substantially the same or similar time, and capturing the images from the detection gratings GR2 at the substantially same or similar time a parallel detection arrangement is provided in which parallel measurements can be taken at the substantially same or similar time at different spatial locations.

FIG. 2D schematically depicts the parallel detection arrangement mentioned above, wherein multiple detectors according to FIG. 2A, in the example of FIG. 2D four detectors, share the same laser output LAS. The radiation is split into four measurements beams by four diffusers DI1-DI4, which also spread the radiation. The measurement beams are focused onto the input gratings GR1 on, e.g., the patterning device and subsequently passed through the projection system to be projected onto the detection gratings GR2. The images from the detection gratings are simultaneously captured by the camera CA that is also shared by the multiple detectors.

The sensor system as depicted in FIGS. 2A and 2D can be used in a control system, which control system also comprises one or more actuators to manipulate one or more components of the lithographic apparatus. In the embodiment of FIG. 2A, the shown first positioner PM has an actuator to move the support structure MT including patterning device MA, the shown second positioner PW has an actuator to move the table WT, and one or more actuators PSA is indicated to manipulate the position and/or shape of one or more optical components, such as a lens and/or mirror.

The control system includes a control unit CU configured to provide drive signals to one or more different actuators on the basis of the measured aberration and/or position. For instance, the drive signal provided to the actuator PSA by the control unit is intended to reduce or minimize the aberration (and thus improve or optimize the performance of the projection system) and/or the drive signal provided to the first and/or second positioner may be intended to align the patterning device MA to the table WTa/WTb.

Illuminating the gratings GR1 at the same time can be done using separate outputs LAS and/or separate radiation sources. In an embodiment, a common radiation source and/or radiation output is used to illuminate all gratings GR1 at the substantially same or similar time. In the same manner, the images from the detection gratings GR2 can be captured by individual cameras CA, but it is more cost effective to use a single camera CA capturing all images at once. Using a single camera CA may also be advantageous from production point of view.

Figure 3:
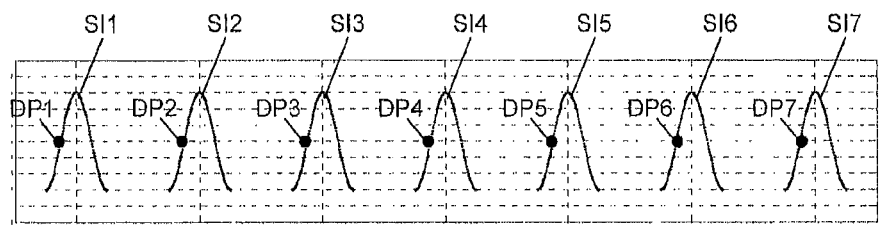
FIG. 3 depicts a possible output of a straightforward parallel detection arrangement.

The straightforward implementation of a parallel detection arrangement is to provide multiple, as identical as possible, detectors next to each other, so that the periodically varying signals as a function of the respective physical quantity are also substantially identical. This is shown as an example in FIG. 3, in which a sensor system including seven detectors provides as many periodically varying signals. In FIG. 3, one period of each of the seven periodically varying signals SI1-SI7 as a function of position in one direction are shown, wherein each periodically varying signal is associated with a distinct spatial location.

In FIG. 3 it can easily be seen that correlated intensity noise in a common camera and/or radiation source (e.g., a laser) results in an apparent position deviation or shift as measured by the sensor system at the seven locations. As an example, seven data points DP1-DP7 are depicted in FIG. 3, wherein each data point is associated with a respective periodically varying signal and indicates a measured position in the case of the absence of noise. When, for instance, intensity noise from a shared noise source results in a simultaneous increase of the intensity of the signals SI1-SI7, the data points DP1-DP7 shift to the right in FIG. 3 which is interpreted as a common shift in position. As it is the measured position including noise that will be used to control the actuator, e.g., the first and/or second positioner PM, PW, the movable object, e.g., the patterning device MA, will not be aligned properly with respect to another object, e.g., the table WTa/WTb, so that errors may occur, such as overlay errors when transferring a pattern to a substrate supported on the substrate table.

The correlated intensity noise may not only come from a shared noise source such as the camera or radiation source, but may be caused by any power or signal component that is shared by all detectors, e.g. a power supply.

In an implementation of a parallel detection arrangement according to an embodiment of the invention, at least one of the detectors responds differently to noise originating from a shared noise source than on one or more other detectors, for instance because the periodically varying signal of at least one detector is different in phase and/or period from the periodically varying signal of one or more other detectors. As a result thereof, the correlated intensity noise will have a different effect on the periodically varying signals depending on phase and/or period, which is not consistent with a pure shift in position. This allows for distinguishing between a real shift in position and the influence of noise.

Figure 4:
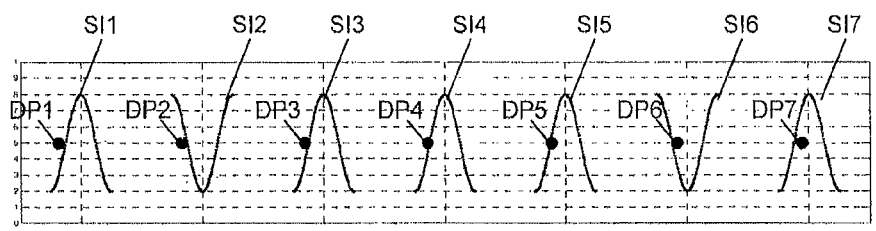
FIG. 4 depicts a possible output of a parallel detection arrangement according to an embodiment of the invention.

In FIG. 4, seven signals SI1-SI7 are depicted originating from a sensor system according to an embodiment of the invention using a parallel detection arrangement with seven detectors, e.g. seven detectors similar to the detector shown in FIG. 2A. The seven signals are comparable to the seven signals of FIG. 3, but in the embodiment of FIG. 4 the second and sixth detectors have a periodically varying signal SI2, SI6 with a phase difference of substantially 180 degrees relative to the periodically varying signals SI1, SI3-SI5, SI7 of the other detectors. Hence, there exists a first sub-set of detectors SI1, SI3-SI5, SI7 and a second sub-set of detectors SI2, SI6 having a periodically varying signal with a phase that is opposite to the phase of the periodically varying signal of the first sub-set of detectors.

In case of a real position shift to the right, i.e. in case the data points DP1-DP7 move to the right in FIG. 4, the second and sixth detectors will show a decrease in signal intensity, whereas the other detectors will show an increase in signal intensity. In the case of correlated intensity noise, all detectors will show an increase in signal intensity, so that for the second and sixth detectors, the position seems to have been shifted to the left, whereas the other detectors indicate that the position has shifted to the right in FIG. 4. Hence, there are conflicting indications in case of correlated noise.

This can advantageously be used in a control system when the conflicting indications can not easily be followed by the control unit and the one or more actuators. In that case, the influence of the correlated intensity noise is reduced although the reproducibility of the individual detectors has not been improved. Hence, which one or more detectors need to change phase relative to the one or more other detectors may be based on the (im)possibilities of the one or more actuators. In an embodiment, the combination of detectors is used that gives the best result.

In other words, the variation in drive signal to the actuator as a result of a signal variation of the multiple detectors due to common noise is less than the variation in the drive signal to the actuator as a result of a signal variation due to a corresponding physical quantity variation, in this case a corresponding position shift.

Shifting the phase of the second and sixth detectors by 180 degrees can be done by adapting the gratings GR1. The applicable one or more gratings can be shifted half a period or the lines and spaces can be interchanged. Alternatively, the detector gratings GR2 can be shifted half a period.

Figure 5:
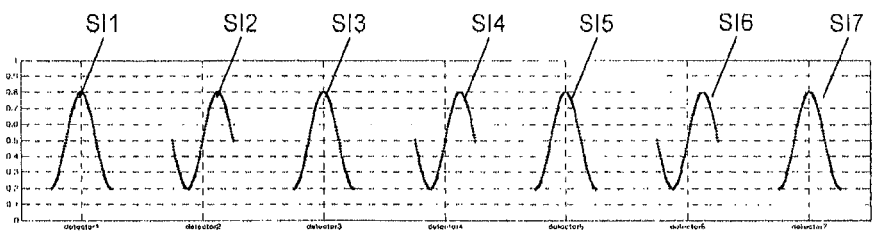
FIG. 5 depicts a possible output of a parallel detection arrangement according to an embodiment of the invention.

FIG. 5 depicts seven signals SI1-SI7 of a sensor system according to a further embodiment using a parallel detection arrangement with seven detectors similar to the embodiment of FIG. 4. In this embodiment, the second, fourth and sixth detector have a periodically varying signal SI2, SI4, SI6 with a phase difference of substantially 90 degrees relative to the periodically varying signals SI1, SI3, SI5, SI7 of the other detectors.

The embodiment of FIG. 5 employs the fact that a detector is most sensitive to a change in the physical quantity, in this case position, in the 'flanks' of the periodically varying signal, and is less sensitive at a maximum or minimum of the periodically varying signal. Due to the phase difference of 90 degrees, the second, fourth and sixth detectors are most sensitive to a change in position when the other detectors are not and vice versa. Thus when obtaining multiple data points, the data points that are used to determine the position, i.e. the data points in the 'flanks' of the periodically varying signals, were not obtained at the same time, and thus the correlation that originally existed between the noise at all detectors is no longer present and thus the influence of the noise will average out to a certain extent.

The same effect of breaking up the correlation between noise at different detectors may be achieved by interchanging the grating portions GP1x and GP1y of some of the detectors, so that during a first measurement information is obtained by a first sub-set of detectors in a first direction and by a second sub-set of detectors in a second direction, and that during a second measurement information is obtained by the first sub-set of detectors in the second direction and by the second sub-set of detectors in the first direction, wherein after the two measurements the information in each direction is combined. Due to the fact that the information associated with one direction is not obtained at the same time, results in the influence of the noise being averaged out to a certain extent.

In an embodiment, there is provided a sensor system to measure a physical quantity, the system including a parallel detection arrangement with multiple detectors to allow measurements in parallel at different spatial locations, wherein the multiple detectors share a noise source, wherein the sensor system is configured such that the multiple detectors each output a signal as a function of the physical quantity, and wherein the sensor system is configured such that at least one detector responds differently to noise originating from the shared noise source than the one or more other detectors.

In an embodiment, the multiple detectors output a periodically varying signal as a function of the physical quantity, and wherein the periodically varying signal from at least one detector differs in period and/or phase from the one or more other detectors. In an embodiment, the at least one detector responds differently to noise originating from the shared noise source, due to the periodically varying signal of the at least one detector differing in period and/or phase from the one or more other detectors. In an embodiment, the periodically varying signal of the at least one detector differs in phase from the one or more other detectors, and wherein the difference in phase is substantially 180 degrees. In an embodiment, the periodically varying signal of the at least one detector differs in phase from the one or more other detectors, and wherein the difference in phase is substantially 90 degrees. In an embodiment, the periodically varying signal of the at least one detector differs in period from the one or more other detectors, and wherein the ratio between the periods is at least 2. In an embodiment, each detector comprises: a radiation output to provide a measurement beam; an input grating to modulate the measurement beam; a detection grating to create multiple overlapping and interfering copies of a wavefront of the modulated measurement beam after it has passed an optical system; and a camera arranged at a distance from the detection grating to capture an image of the overlapping and interfering copies of the wavefront, wherein the difference in period and/or phase between the periodically varying signals of the detectors is caused by differences in the input and/or detection gratings.

In an embodiment, there is provided a sensor system to measure a physical quantity in at least two directions, the system including a parallel detection arrangement with multiple detectors to allow measurements in parallel at different spatial locations, wherein the multiple detectors share a noise source, wherein each detector is configured to measure in one direction of the at least two directions at a time, wherein the sensor system is configured such that the multiple detectors each output a signal as a function of the physical quantity, and wherein the sensor system is configured such that during a parallel measurement at least one detector is measuring in a direction different from the one or more other detectors at the same time.

In an embodiment, the multiple detectors output a periodically varying signal as a function of the physical quantity. In an embodiment, each detector comprises: a radiation output to provide a measurement beam; an input grating to modulate the measurement beam; a detection grating to create multiple overlapping and interfering copies of a wavefront of the modulated measurement beam after it has passed an optical system; and a camera arranged at a distance from the detection grating to capture an image of the overlapping and interfering copies of the wavefront, wherein the measurement direction is determined by the input and/or detection grating. In an embodiment, the multiple detectors share the same radiation output and/or share the same camera as the noise source.

In an embodiment, there is provided a control system comprising a sensor system as described herein, an actuator, and a control unit configured to provide a drive signal to the actuator based on the output of the multiple detectors. In an embodiment, the multiple detectors and the actuator are configured such that a signal variation in the output of the multiple detectors due to noise originating from the noise source cannot be followed or cannot be followed completely by the actuator.

In an embodiment, there is provided a lithographic apparatus comprising a sensor system as described herein. In an embodiment, there is provided a lithographic apparatus comprising: a sensor system as described herein; and a pattern transfer system configured to provide a pattern onto a substrate. In an embodiment, each detector of the sensor system comprises: a radiation output to provide a measurement beam; an input grating to modulate the measurement beam to form a modulated measurement beam; a detection grating to create multiple overlapping and interfering copies of a wavefront of the modulated measurement beam; and a camera arranged at a distance from the detection grating to capture an image of the overlapping and interfering copies of the wavefront, wherein the lithographic apparatus further comprises: a support constructed to support a patterning device, the patterning device comprising the input gratings of the multiple detectors; a substrate table constructed to hold a substrate, the substrate table comprising the detection gratings; and a projection system configured to project the modulated measurement beams onto the respective detection gratings on the substrate table, wherein the physical quantity to be measured by the sensor system is the position of the input gratings relative to the substrate table. In an embodiment, the lithographic apparatus comprises a first positioner to position the support and/or a second positioner to position the substrate table, wherein the lithographic apparatus comprises a control unit configured to provide drive signals to the first and/or second positioner based on an output of the multiple detectors.

In an embodiment, there is provided a pattern transferring method comprising: measuring a position of a patterning device relative to a substrate table configured to hold a substrate using a sensor system as described herein, the patterning device configured to impart a radiation beam with a pattern in its cross-section to form a patterned radiation beam; aligning a target portion on a substrate held by the substrate table with the patterning device based on the measured position; and projecting the patterned radiation beam onto the target portion of the substrate to transfer a pattern from the patterning device to the substrate. In an embodiment, the patterning device comprises a grating per detector and wherein the position of the patterning device is measured by illuminating the grating of the patterning device with a measurement beam to form a modulated measurement beam, projecting the modulated measurement beam onto a detection grating provided on the substrate table to create multiple overlapping and interfering copies of a wavefront of the modulated measurement beam, capturing an image of the overlapping and interfering copies of the wavefront, and calculating the position of the patterning device relative to the substrate table from the captured image.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A sensor system to measure a physical quantity in at least two directions, the system including a parallel detection arrangement with multiple detectors to allow measurements in parallel at different spatial locations, wherein the multiple detectors share a noise source, wherein each detector of the multiple detectors is configured to measure in one direction of the at least two directions at a time, wherein the sensor system is configured such that the multiple detectors each output a signal as a function of the physical quantity, and wherein the sensor system is configured such that during a parallel measurement at least one detector of the multiple detectors is measuring in a direction different from the one or more other detectors of the multiple detectors at the same time, wherein the multiple detectors share a same radiation output and/or share a same camera as the noise source.

2. The sensor system according to claim 1, wherein the multiple detectors output a periodically varying signal as a function of the physical quantity.

3. The sensor system according to claim 2, wherein the periodically varying signal from the at least one detector differs in period and/or phase from the one or more other detectors.

4. The sensor system according to claim 3, wherein the at least one detector responds differently to noise originating from the shared noise source, due to the periodically varying signal of the at least one detector differing in period and/or phase from the one or more other detectors.

5. The sensor system according to claim 3, wherein the periodically varying signal of the at least one detector differs in phase from the one or more other detectors, and wherein the difference in phase is substantially 180 degrees.

6. The sensor system according to claim 3, wherein the periodically varying signal of the at least one detector differs in phase from the one or more other detectors, and wherein the difference in phase is substantially 90 degrees.

7. The sensor system according to claim 3, wherein the periodically varying signal of the at least one detector differs in period from the one or more other detectors, and wherein the ratio between the periods is at least 2.

8. The sensor system according to claim 1, wherein each detector of the multiple detectors comprises:
   a detection grating to create multiple overlapping and interfering copies of a wavefront of a measurement beam modulated by an input grating after it has passed an optical system; and
   a camera arranged at a distance from the detection grating to capture an image of the overlapping and interfering copies of the wavefront,
   wherein the measurement direction is determined by the input and/or detection grating.

9. A control system comprising the sensor system according to claim 1, an actuator, and a control unit configured to provide a drive signal to the actuator based on the output of the multiple detectors.

10. The control system according to claim 9, wherein the multiple detectors and the actuator are configured such that a signal variation in the output of the multiple detectors due to noise originating from the noise source cannot be followed or cannot be followed completely by the actuator.

11. A lithographic apparatus comprising:
    the sensor system according to claim 1; and
    a pattern transfer system configured to provide a pattern onto a substrate.

12. The lithographic apparatus according to claim 11, wherein each detector of the multiple detectors of the sensor system comprises:
    a detection grating to create multiple overlapping and interfering copies of a wavefront of a measurement beam modulated by an input grating; and
    a camera arranged at a distance from the detection grating to capture an image of the overlapping and interfering copies of the wavefront,
    wherein the pattern transfer system further comprises:
    a support constructed to support a patterning device, the patterning device comprising input gratings of the multiple detectors;
    a substrate table constructed to hold a substrate, the substrate table comprising the detection gratings; and
    a projection system configured to project the modulated measurement beams onto the respective detection gratings on the substrate table,
    wherein the physical quantity to be measured by the sensor system is the position of the input gratings relative to the substrate table.

13. The lithographic apparatus according to claim 12, comprising a first positioner to position the support and/or a second positioner to position the substrate table, wherein the lithographic apparatus comprises a control unit configured to provide drive signals to the first and/or second positioner based on an output of the multiple detectors.

14. The sensor system according to claim 1, wherein at least two detectors of the one or more other detectors respond substantially the same to noise originating from the shared noise source.

15. A pattern transferring method comprising:
    measuring a position of a patterning device relative to a substrate table configured to hold a substrate using a sensor system, the patterning device configured to impart a radiation beam with a pattern in its cross-section to form a patterned radiation beam and the sensor system including a parallel detection arrangement with multiple detectors to allow measurements in parallel at different spatial locations, wherein the multiple detectors share a noise source, wherein each detector of the multiple detectors is configured to measure in one direction of the at least two directions at a time, wherein the sensor system is configured such that the multiple detectors each output a signal as a function of a physical quantity, and wherein the sensor system is configured such that during a parallel measurement at least one detector of the multiple detectors is measuring in a direction different from the one or more other detectors of the multiple detectors at the same time;

aligning a target portion on a substrate held by the substrate table with the patterning device based on the measured position; and projecting the patterned radiation beam onto the target portion of the substrate to transfer a pattern from the patterning device to the substrate.

16. The pattern transferring method according to claim 15, wherein the patterning device comprises a grating per detector of the multiple detectors and wherein the position of the patterning device is measured by illuminating the grating of the patterning device with a measurement beam to form a modulated measurement beam, projecting the modulated measurement beam onto a detection grating provided on the substrate table to create multiple overlapping and interfering copies of a wavefront of the modulated measurement beam, capturing an image of the overlapping and interfering copies of the wavefront, and calculating the position of the patterning device relative to the substrate table from the captured image.

17. The pattern transferring method according to claim 15, wherein at least two detectors of the one or more other detectors respond substantially the same to noise originating from the shared noise source.

18. A method comprising:

measuring radiation by multiple detectors to allow measurements in parallel at different spatial locations, wherein the multiple detectors share a noise source, wherein each detector of the multiple detectors is configured to measure in one direction of at least two directions at a time, wherein the multiple detectors each output a signal as a function of a physical quantity, and wherein during a parallel measurement, at least one detector of the multiple detectors is measuring in a direction different from the one or more other detectors of the multiple detectors at the same time, wherein the multiple detectors output a periodically varying signal as a function of the physical quantity, and wherein the periodically varying signal from the at least one detector differs in period and/or phase from the one or more other detectors; and deriving a value of the physical quantity based on the output of the multiple detectors.

19. A sensor system to measure a physical quantity in at least two directions, the system including a parallel detection arrangement with multiple detectors to allow measurements in parallel at different spatial locations, wherein the multiple detectors share a noise source, wherein each detector of the multiple detectors is configured to measure in only one respective direction of the at least two directions at a first time, wherein the sensor system is configured such that the multiple detectors each output a signal as a function of the physical quantity, and wherein the sensor system is configured such that during a parallel measurement at least one detector of the multiple detectors is measuring in a direction different from the one or more other detectors of the multiple detectors at a second time and at least one detector of the multiple detectors is measuring in a different direction at the second time from at the first time.

20. The sensor system according to claim 19, wherein the multiple detectors share a same radiation output and/or share a same camera as the noise source.

* * * * *